United States Patent
Bhalla et al.

(10) Patent No.: US 10,396,215 B2
(45) Date of Patent: Aug. 27, 2019

(54) TRENCH VERTICAL JFET WITH IMPROVED THRESHOLD VOLTAGE CONTROL

(71) Applicant: United Silicon Carbide, Inc., Monmouth Junction, NJ (US)

(72) Inventors: Anup Bhalla, Princeton Junction, NJ (US); Peter Alexandrov, Lawrence, NJ (US)

(73) Assignee: United Silicon Carbide, Inc., Monmouth Junction, NJ (US)

( * ) Notice: Subject to any disclaimer, the term of this patent is extended or adjusted under 35 U.S.C. 154(b) by 0 days.

(21) Appl. No.: 15/260,548

(22) Filed: Sep. 9, 2016

(65) Prior Publication Data
US 2016/0380117 A1  Dec. 29, 2016

Related U.S. Application Data

(63) Continuation-in-part of application No. 14/642,936, filed on Mar. 10, 2015, now abandoned.

(51) Int. Cl.
*H01L 29/808* (2006.01)
*H01L 29/24* (2006.01)
(Continued)

(52) U.S. Cl.
CPC .... *H01L 29/8083* (2013.01); *H01L 21/26586* (2013.01); *H01L 29/0657* (2013.01);
(Continued)

(58) Field of Classification Search
CPC ............... H01L 29/808; H01L 29/24
See application file for complete search history.

(56) References Cited

U.S. PATENT DOCUMENTS 4,364,072 A * 12/1982 Nishizawa .......... H01L 29/1025
257/136
4,587,712 A   5/1986 Baliga
(Continued)

FOREIGN PATENT DOCUMENTS

CN  204155938 U  2/2015
EP  1783826 A1  5/2007

OTHER PUBLICATIONS

Ritenour et al., "Saturation Current Improvement in 1200 V Normally-Off SiC VJFETs Using Non-Uniform Channel Doping", International Symposium on Power Semiconductor Devices & IC'S, Hiroshima, Jun. 1010, 10-2, 361-364.

*Primary Examiner* — Joseph C. Nicely
*Assistant Examiner* — Lamont B Koo
(74) *Attorney, Agent, or Firm* — BakerHostetler (57) ABSTRACT

Trench JFETs may be created by etching trenches into the topside of a substrate of a first doping type to form mesas. The substrate is made up of a backside drain layer, a middle drift layer, and topside source layer. The etching goes through the source layer and partly into the drift layer. Gate regions are formed on the sides and bottoms of the trenches using doping of a second type. Vertical channel regions are formed behind the vertical gate segments via angled implantation using a doping of the first kind, providing improved threshold voltage control. Optionally the substrate may include a lightly doped channel layer between the drift and source layers, such that the mesas include a lightly doped channel region that more strongly contrasts with the implanted vertical channel regions.

12 Claims, 9 Drawing Sheets

(51) Int. Cl.
  *H01L 29/06* (2006.01)
  *H01L 29/10* (2006.01)
  *H01L 29/20* (2006.01)
  *H01L 29/16* (2006.01)
  *H01L 21/265* (2006.01)
  *H01L 29/66* (2006.01)

(52) U.S. Cl.
  CPC ...... *H01L 29/1058* (2013.01); *H01L 29/1608* (2013.01); *H01L 29/2003* (2013.01); *H01L 29/66068* (2013.01); *H01L 29/66924* (2013.01)

(56) References Cited

U.S. PATENT DOCUMENTS

| | | | |
|---|---|---|---|
| 6,653,666 B2 | 11/2003 | Mitlehner et al. | |
| 7,005,678 B2 | 2/2006 | Kumar et al. | |
| 7,009,228 B1 | 3/2006 | Yu | |
| 7,230,275 B2 | 6/2007 | Kumar et al. | |
| 7,420,245 B2 | 9/2008 | Yamashita et al. | |
| 7,479,672 B2 | 1/2009 | Zhao | |
| 7,691,694 B2 | 4/2010 | Kumar et al. | |
| 7,750,377 B2 | 7/2010 | Hoshino et al. | |
| 7,977,713 B2 | 7/2011 | Sankin et al. | |
| 7,994,568 B2 | 8/2011 | Chung | |
| 8,058,655 B2 | 11/2011 | Sheridan et al. | |
| 8,202,772 B2 | 6/2012 | Sheridan et al. | |
| 8,436,397 B2 | 5/2013 | Shimizu et al. | |
| 8,860,098 B2 | 10/2014 | Bhalla et al. | |
| 2003/0178672 A1 | 9/2003 | Hatekeyama et al. | |
| 2005/0167695 A1 | 8/2005 | Yilmaz | |
| 2006/0071217 A1 | 4/2006 | Ohyanagi et al. | |
| 2006/0214242 A1 | 9/2006 | Carta et al. | |
| 2007/0037327 A1 | 2/2007 | Herrick et al. | |
| 2007/0187715 A1* | 8/2007 | Zhao | H01L 29/8083 257/135 |
| 2008/0035987 A1 | 2/2008 | Hebert | |
| 2008/0308838 A1 | 12/2008 | McNutt et al. | |
| 2009/0166722 A1 | 7/2009 | Hebert | |
| 2009/0206396 A1 | 8/2009 | Chung | |
| 2009/0278177 A1* | 11/2009 | Sankin | H01L 29/1058 257/272 |
| 2010/0148186 A1* | 6/2010 | Sheridan | H01L 21/047 257/77 |
| 2010/0163935 A1 | 7/2010 | Shimizu et al. | |
| 2010/0244126 A1 | 9/2010 | Purtell et al. | |
| 2011/0133212 A1 | 6/2011 | Sheridan et al. | |
| 2011/0169103 A1 | 7/2011 | Darwish et al. | |
| 2013/0043468 A1* | 2/2013 | Adekore | H01L 29/267 257/43 |

* cited by examiner

TRENCH VERTICAL JFET WITH IMPROVED THRESHOLD VOLTAGE CONTROL

CROSS-REFERENCE TO RELATED APPLICATIONS

This application is a continuation-in-part of U.S. patent application Ser. No. 14/642,936 filed on Mar. 10, 2015 entitled "Trench Vertical JFET with Improved Threshold Voltage Control," the contents of which are hereby incorporated by reference in their entirety.

FIELD OF THE DISCLOSURE

The instant disclosure is in the field of high-current and high-voltage semiconductor devices. For example, high voltage normally-on and normally-off vertical junction field effect transistors (VJFETs) and methods of making the same are disclosed.

BACKGROUND

Vertical junction field-effect transistors (JFETs) made from materials such as silicon carbide (SiC) and gallium nitride (GaN) are useful in power electronic circuits, such as power factor correction (PFC) devices, DC-DC converters, DC-AC inverters, and motor drives. Vertical JFET devices may include active cell regions and termination regions.

SUMMARY OF THE INVENTION

Trench JFETs may be created by etching trenches into the topside of a substrate of a first doping type. The substrate is made up of a backside drain layer, a middle drift layer, and topside source layer. Mesas result between the trenches. The etching goes through the source layer and may extend partly into the drift layer. Gate regions are formed on the sides and bottoms of the trenches using doping of a second type. Vertical channel regions are formed behind the vertical gate segments via angled implantation using a doping of the first kind, providing improved threshold voltage control. Optionally the substrate may include a lightly doped channel layer between the drift and source layers, such that the mesas include a lightly doped channel region that more strongly contrasts with the implanted vertical channel regions. The substrate may be made from SiC, GaN, and/or other semiconductor materials.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed.

DETAILED DESCRIPTION

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

Trench JFETs may be created by etching trenches into the topside of a substrate of a first doping type. The substrate is made up of a backside drain layer, a middle drift layer, and topside source layer. Mesas result between the trenches. The etching goes through the source layer and may extend partly into the drift layer. Gate regions are formed on the sides and bottoms of the trenches using doping of a second type. Vertical channel regions are formed behind the vertical gate segments via angled implantation using a doping of the first kind, providing improved threshold voltage control. Optionally, the substrate may include a lightly doped channel layer between the drift and source layers, such that the mesas include a lightly doped channel region that more strongly contrasts with the implanted vertical channel regions. The substrate may be made from SiC, GaN, and/or other semiconductor materials.

Figure 1:
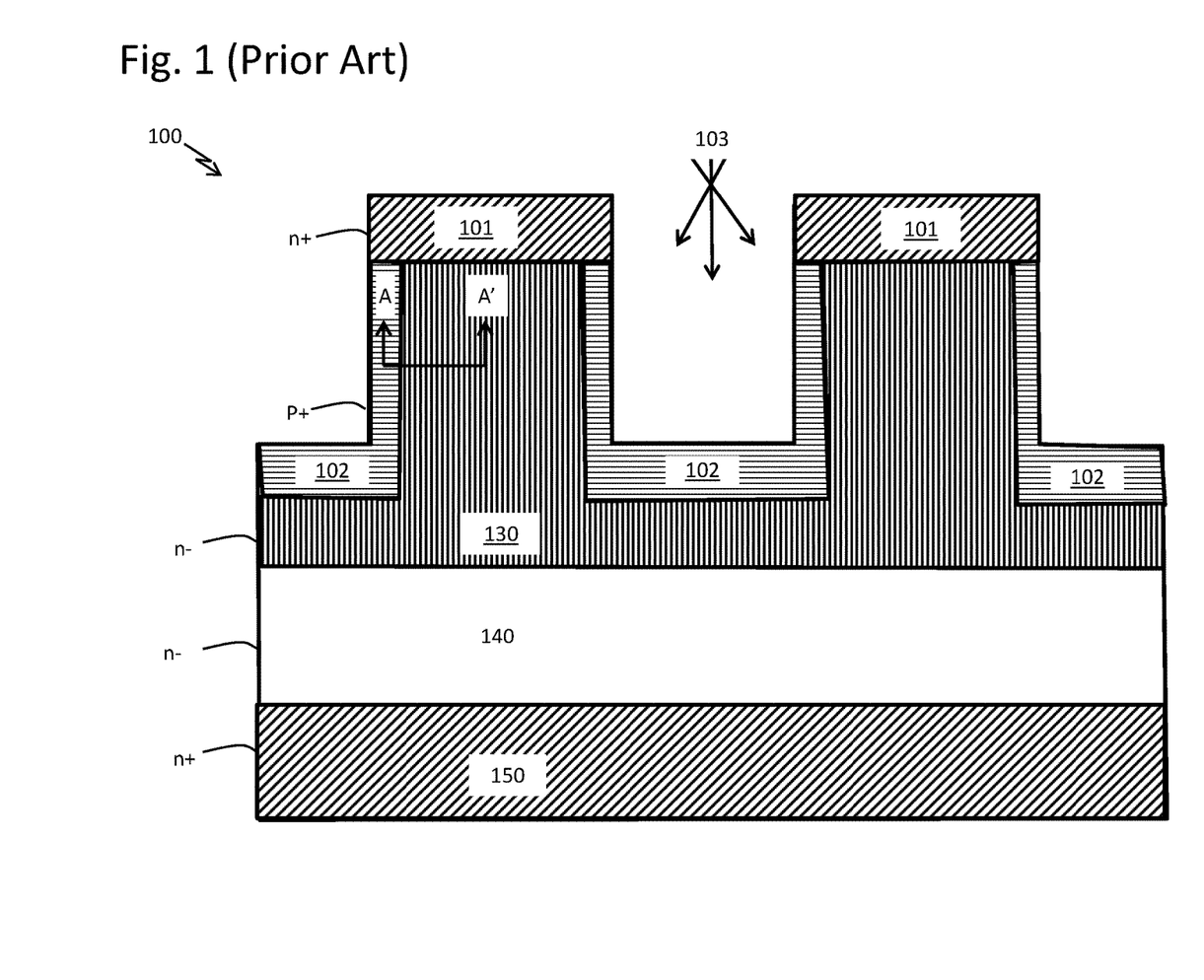
FIG. 1 depicts a vertical cross-sectional view of a prior art trench JFET with an angle-implanted gate.

FIG. 1 is a vertical cross-sectional view of an exemplary prior art trench JFET. Such devices commonly comprise a multiple epitaxial layer structure including a substrate 150, and a drift layer 140 doped with a first kind of doping (n or p) to withstand the desired blocking voltage. Atop the drift layer is a channel layer 130, which is usually more heavily doped with the first kind of doping than the drift layer. The topmost layer 101 is the heavily doped source region of the first kind of doping. Trenches are etched through the source 101 and into, but not all the way through, the channel layer 130. The bottom and sidewalls of these trenches are implanted using vertical and angled implants 103 respectively to form the gate region 102. The gate doping type is opposite the doping type of the source, channel, drift and substrate regions. In practice, contacts (not shown) include source contacts made to the source region 101, a drain contact made to the bottom of the substrate region 150, and gate contact is made to the gate region 102.

The threshold voltage of such a JFET is set by the voltage difference that needs to be applied between the gate and source in order to deplete the channel region lying between the gate regions 102. It therefore depends critically on the doping of the channel layer 130 and the width of the etched trenches, which in turn determines the spacing between the gate regions 102. In practice, these factors lead to a large variation in the charge resident between adjacent gate regions 102, which is the product of the doping level, and the space between regions 102. In turn, this leads to large variations in device threshold voltage. This is due in part to the fact that the doping level may fluctuate a great deal due to the limited level of control possible with epitaxial layer growth. +/−10% to 20% variation is common. The space between the gate regions 102 also fluctuates due to photolithography and etch profile variations of the mesas between trenches. Such fluctuation can be several 0.1 um without use of sophisticated equipment.

Figure 2:
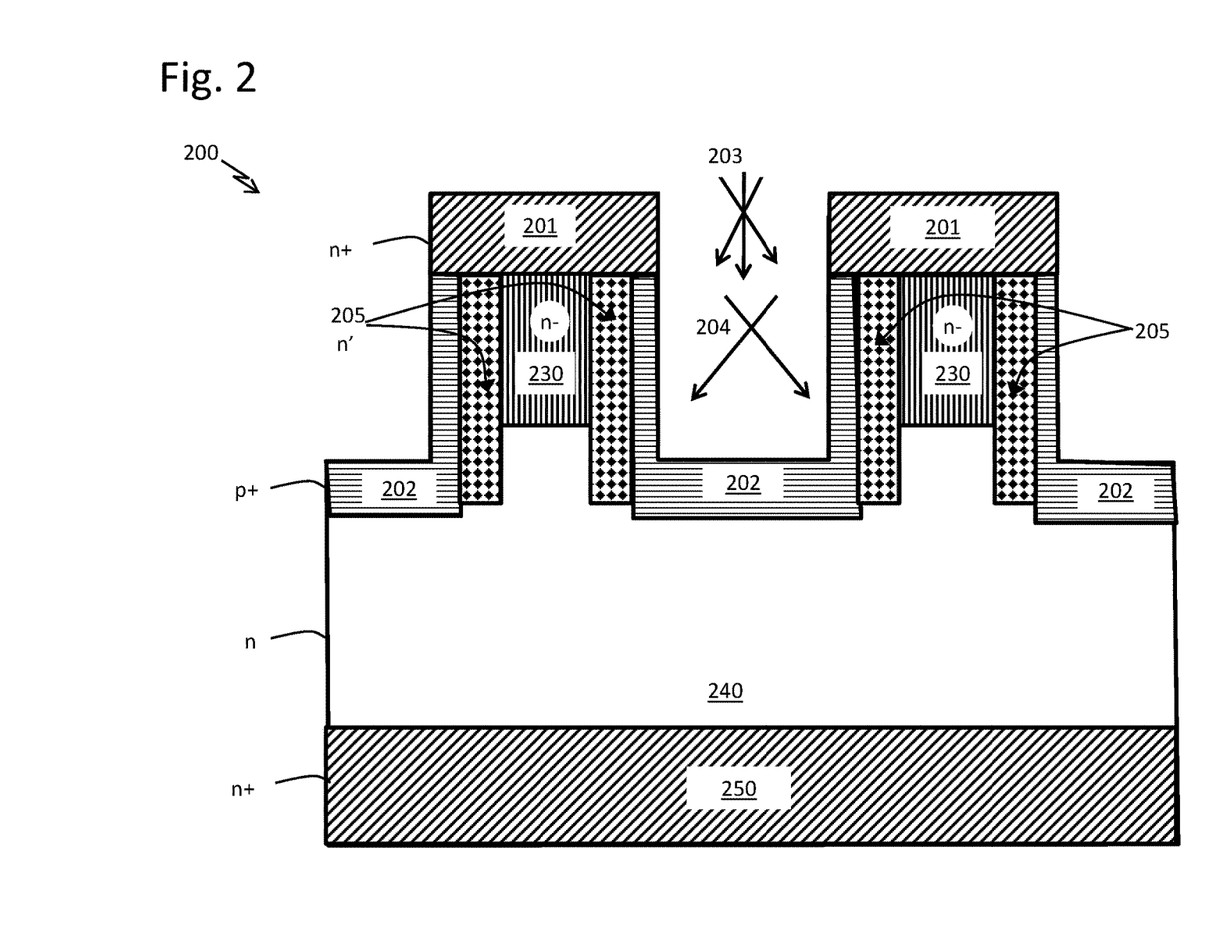
FIG. 2 depicts a vertical cross-sectional view of an embodiment of a trench JFET with an angle-implanted channel region

FIG. 2 is a vertical cross-sectional view of an exemplary trench JFET with an angle-implanted vertical channel region. Since the device threshold voltage is determined by the charge resident between the gate regions 202, this structure is devised to precisely control this charge. This is achieved by changing the epitaxial structure and using an angled implant to dope the channel. Like the device depicted in FIG. 1, the JFET of FIG. 2 has a drift region 240 atop a substrate 250. Rising from the drift region 240 are active cell mesas. Atop the mesas is source layer 201. The substrate 250, the drift 240, and the source 201 are doped with a doping of a first kind. In FIGS. 2-4, these regions and channel regions are depicted with a first kind of doping being n-type, and a second doping kind for the gate regions is shown as being p-type, such that the structures form NPN devices. In practice, the doping types can be switched to use the same structures to form PNP devices.

In FIG. 2, the trenches are depicted as being etched through the source layer 201 and all the way through a lightly doped channel core layer 230 into the drift layer 240. Therefore, compared to the channel layer 130 of FIG. 1, the channel core layer 230 of FIG. 2 is shallower than the trench. The channel core layer 230 is as lightly doped as possible to minimize its charge. The channel core layer 230 is doped with the first doping type. For a 1200V SiC JFET, for example, it may be possible to use a drift layer doping of $1e16$ cm$^{-3}$ along with a channel core layer doping of $1e15$ cm$^{-3}$. To create a very high voltage JFET, in contrast, it may be necessary to use a doping level of $1e15$ cm$^{-3}$ for both the drift and the channel core layer 230, so in that case, the drift 240 and channel core layer 230 may be synonymous.

The bottom and sidewalls of the trenches are implanted using vertical and angled implants 203 to form the gate regions 202. The gate doping type is of a second type (p or n) which is opposite the doping type of the source, channel, drift and substrate regions.

Vertical channel regions 205 may then be angle implanted along the directions 204. The vertical channel doping type is of the first doping type, i.e., the same doping type as the source and the opposite of the doping type of the gate. This implantation may be done at a high energy to achieve a deeper implant than the gate sidewall implant. Hence the vertical channel regions 205 may be formed after forming the gate regions 202.

In practice, contacts (not shown) include a source contact made to the source region 201, a drain contact made to the bottom of the substrate region 250, and a gate contact made to the gate regions 202.

The charge between the gate regions 202 is controlled by the charge pockets 205 which determine the device threshold voltage. The background charge contribution of the region 230 is minimized by its light doping level, and so does not significantly impact threshold. As an example, the charge contribution of the channel core region 230 between the gate regions 202 can be made to be less than 5% of the charge resident in the pockets 205. In such a case, if there is a variation in the doping level of region 230 on the order of 20%, that variation will therefore have less than a 1% impact in the total charge between the gate regions 202, and so will not cause any significant threshold variation. Similarly, if the photolithographic and etch processes used to form the trenches lead to significant variations in the mesa width between the gate regions 202, this will lead to a variation only in the charge contributed by layer 230. Again, this effect can be made very small. Since the depths of the gate regions 202 and implanted channel pockets 205 with respect to the trench sidewalls are accurately determined by implant angle and energy, which can be controlled to better than 3% accuracy, the charge between the gate regions 202 is substantially invariant even if mesa width (i.e., the width between the trench regions) changes. By these means, the effect of both the epitaxial layer doping variations and mesa width variations resulting from photolithographic and etch process variations is essentially negated.

For example, to create a 1200V SiC JFET, a drift layer doping of $1e16$ cm$^{-3}$ may be used, along with a channel core layer doping at $1e15$ cm$^{-3}$, and a source region doping at $2e19$ cm$^{-3}$ in doping. If the mesa is 1 μm wide, the channel layer charge is:

$$1e15 * 1 \text{ μm} = 1e11 \text{ cm}^{-2}$$

The vertical channel implant charge pocket depends on the desired threshold. Typical numbers may be a doping of $1e17$ cm$^{-3}$, for each of two regions 0.2 μm in width. With one of these charge pockets on each side, the total charge in the pockets is:

$$2 * 1e17 \text{ cm}^{-3} * 0.2 \text{ μm} = 4e12 \text{ cm}^{-2}$$

In other words, there will be forty times more charge in the implanted channel regions than in the channel core layer. Hence, the implanted charge dominates the voltage threshold effect.

Figure 3:
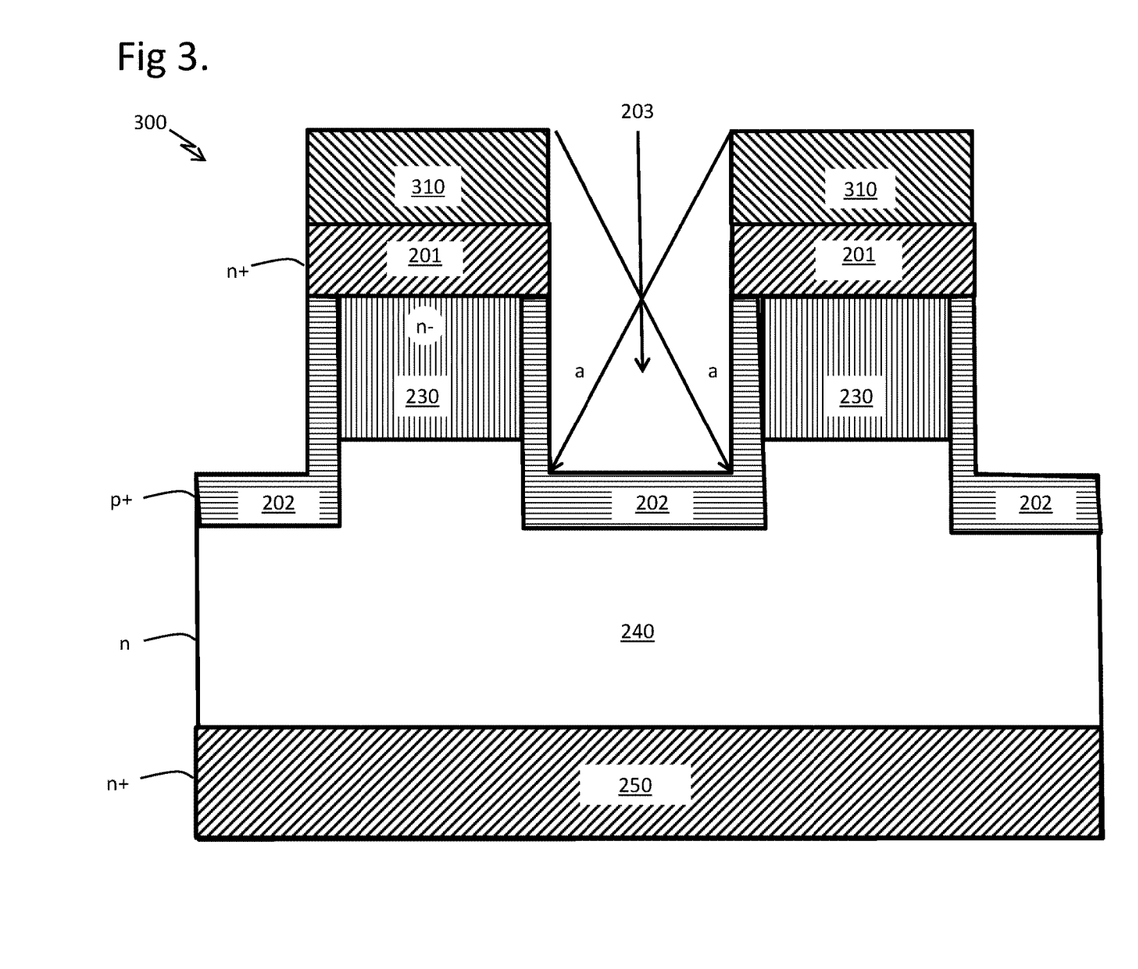
FIGS. 3 and 4 depict vertical cross-sectional views of the trench JFET embodiment of FIG. 2 during manufacture.
Figure 4:
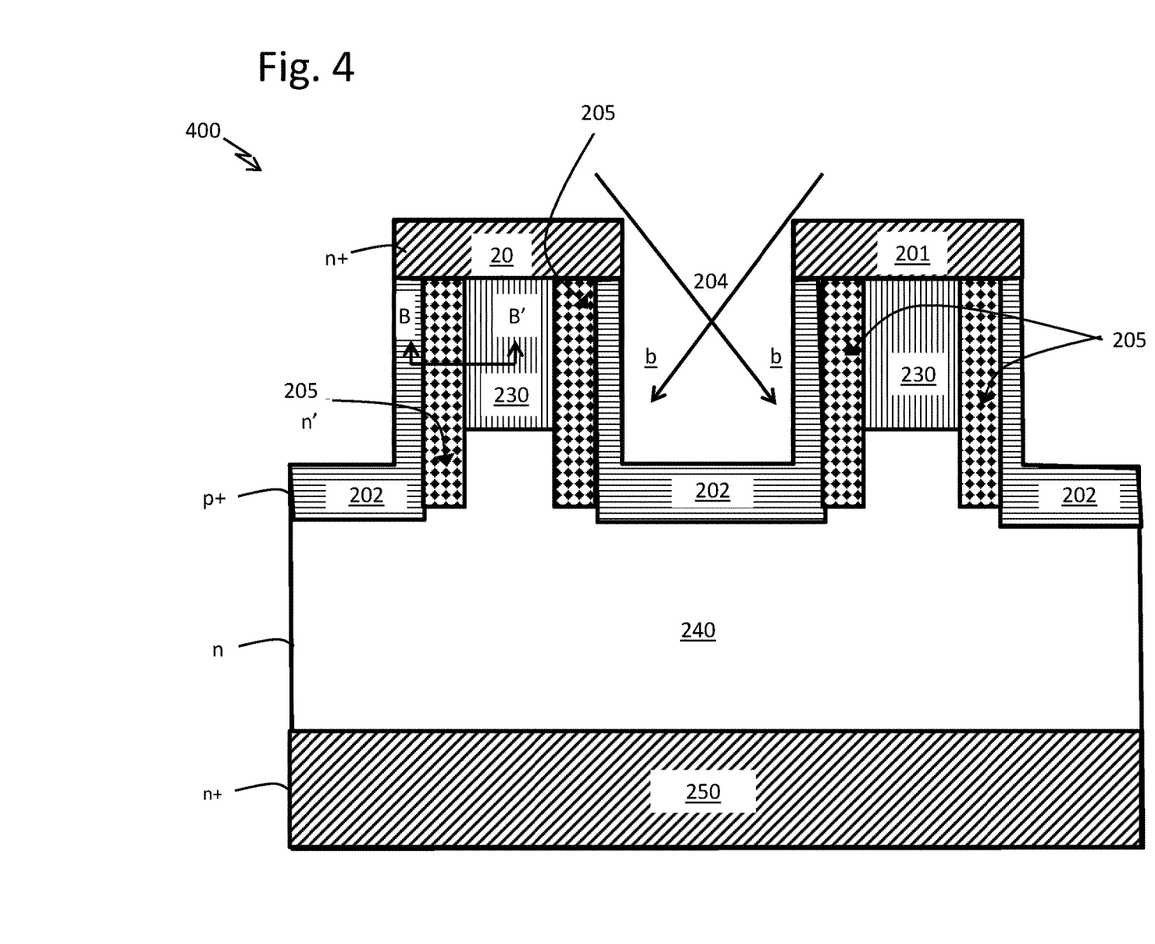

FIGS. 3 and 4 are vertical cross-sectional views of the trench JFET of FIG. 2 at different points during its manufacture. In FIG. 3, a gate implant 203 is applied after the trenches are etched through a lightly doped channel layer 230. The implantation is done with a hard masking layer 310 in place. The hard masking layer 310 may comprise oxide, metal, or both. This hard masking layer 310 is also used, as it is in a standard vertical JFET process, to prevent the gate implant from counter doping the source regions 201, since the gate implant dopant is of opposite polarity to the source. The gate implant 203 includes implantation at an angle α. Angle α is selected based on the worst case assessment of: trench depth, hard masking layer 310 thickness, and trench width. This is to ensure the angled implant beam is not shadowed by adjacent mesas. Implant energy and charge are set to ensure there is sufficient charge to supply the gate side of the depletion region to support a gate-source breakdown well above the maximum gate-source voltage rating of the device. The gate dopant 202 at the bottom may be disposed deeper and doped to a higher level than the sidewalls, e.g., by including a vertical or less steep implantation in gate implant 203. A higher dopant level at the bottom of the trenches is helpful since this is the place where the gate contact is usually made.

In FIG. 4, the hard masking layer 310 is removed, and then the channel implant 204 is performed at an angle β. In practice, the channel implant 204 can be performed with the hard masking 310 in place. However, first removing the hard masking layer 310 allows the channel implant 204 to be applied at a larger angle β. This in turn makes it easier to dispose the charge pockets 205 deeper than the gate without resorting to very high implantation energies.

Not shown in FIG. 4, during the channel implant, the edge areas of the device, e.g., termination regions, may need to be shielded from the channel implant 204, so that it does not affect any region other than the active JFET cells where the current conduction in the on-state is to occur.

The structure of FIG. 4 shows that the desired depth of the channel implant along the sidewall is close to the depth of the gate regions. In practice it may be slightly shallower or deeper. If it is too shallow, it will lead to higher on-resistance but better off-state blocking, while being deeper will do the opposite. It is also allowable to make this channel implant so deep that it wraps around the gate regions 302 both along the sides and the bottoms. The drop in blocking capability must then be compensated by reducing the drift region 240 doping, so that the target breakdown rating can still be met.

It is typically (but not always) preferred to modify the channel layer 230 to be as lightly doped as possible, and decrease its depth, so that the trenches will be etched all the way through it, accounting for normal process variations of epitaxial thickness and trench etch depth control. At higher blocking voltages (e.g. greater than 3300V for 4H—SiC) the drift region doping is light enough that the channel layer 230 doping may be made the same as the drift layer doping.

Figure 5:
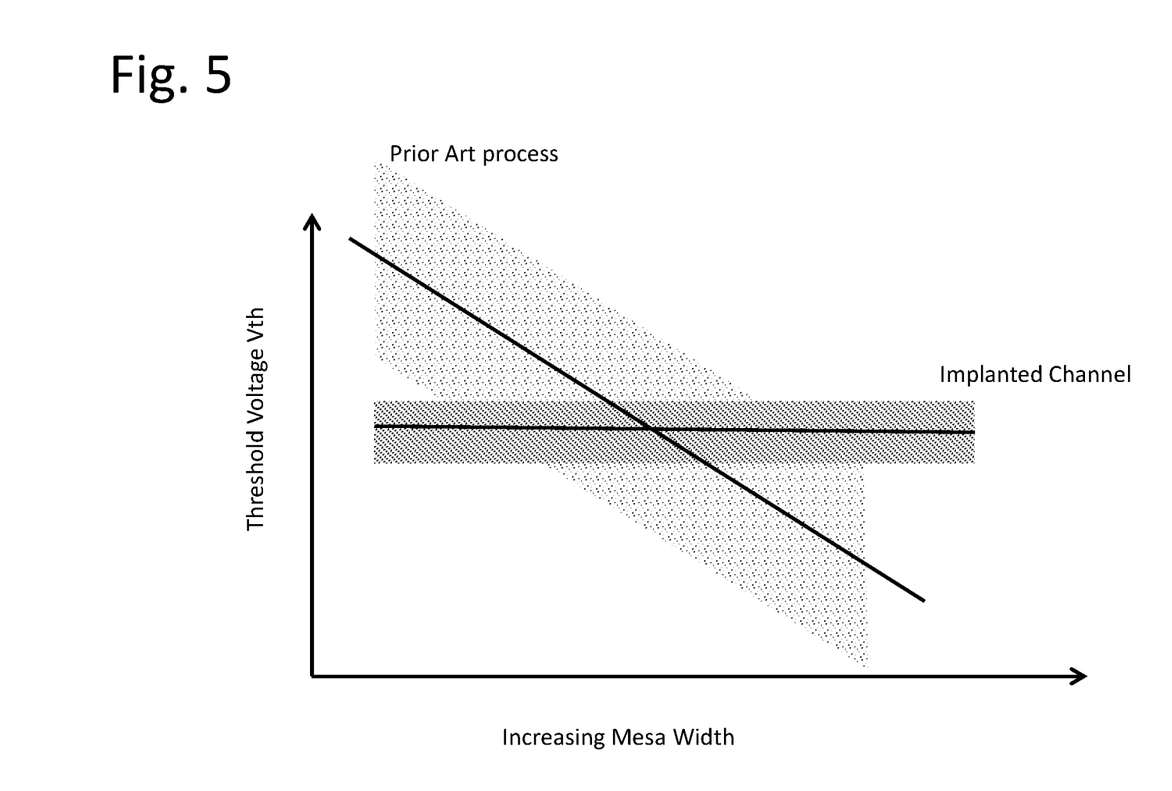
FIG. 5 is a chart comparing threshold voltage variation over varied mesa width for prior art and presently presented techniques.

FIG. 5 shows the outcome of the precision of threshold voltage control with fluctuations in implant, epitaxial growth and mesa width parameters. The lines show the sensitivity to mesa width variations with all other parameters held constant. The shaded regions surrounding the lines indicate the additional fluctuation that results from epitaxial layer doping and implant control variations.

The geometries of the trench JFETS described herein may vary considerably. For example in FIGS. 2, 3, and 4, the typical vertical thickness of source regions 201 may between 0.1 and 1 um, and the depth of the trench beyond source regions 201 may be in the range of 0.5 to 3 um. The width of the mesas and trenches may generally be between 0.3 and 2 um, for example. The p+ gate region 202 that extends below the trench bottom may extend from 0.2 to 2 um, generally. The channel implant regions 205 may extend beyond the p+ gate regions 202 by, for example, 0.1 to 0.5 um. Other geometries are possible, of course, depending on desired operating characteristics.

The geometry and doping of the n-region 230 at the core of the mesa affects operations of trench JFETs such as those shown in FIGS. 2, 3, and 4. To optimize control of the threshold voltage, the doping level of region 230 should be much lower than that of the drift region 240 and of the implanted channel regions 205. For example, the doping level of region 230 may be at least 10× lower than that of the drift region 240 and 10 to 100× lower than the peak concentration in the implanted channels 205. For example, for a 650 V normally-on device, the drift region 240 may be doped in the range of 2e16 to 3e16 cm-3, and the n-region 230 may be doped at 1e15 cm-3, while the peak concentration in the implanted channel regions 205 may be between 4e17 and 4e18 cm-3. Due to the very low level of the doping in region 230, variations in mesa width have almost no effect on the net N-charge in the Mesa regions, and this in turn makes the threshold voltage (Vth) invariant to such process variations.

In the formation of a normally-on JFET, the channel peak concentration may be quite high, e.g., 4e17 to 4e18 cm-3. Since it may require a gate-source Vgs=-15V to -20V to fully turn-off such a device, it may be necessary to have a gate-source breakdown voltage, e.g., of at least 30-40V, so that such a reverse bias can in fact be applied with low leakage current. For this reason, the P-gate sidewall concentration may be reduced, and the peak of the channel implant 205 may be spaced away from the junction, deeper into the mesa region. This in turn creates a graded junction with higher breakdown voltage. In fact, in this device, even the source region 201 is doped such that the lower portion near the junction with the p-gate forms a similarly graded junction.

Figure 6:
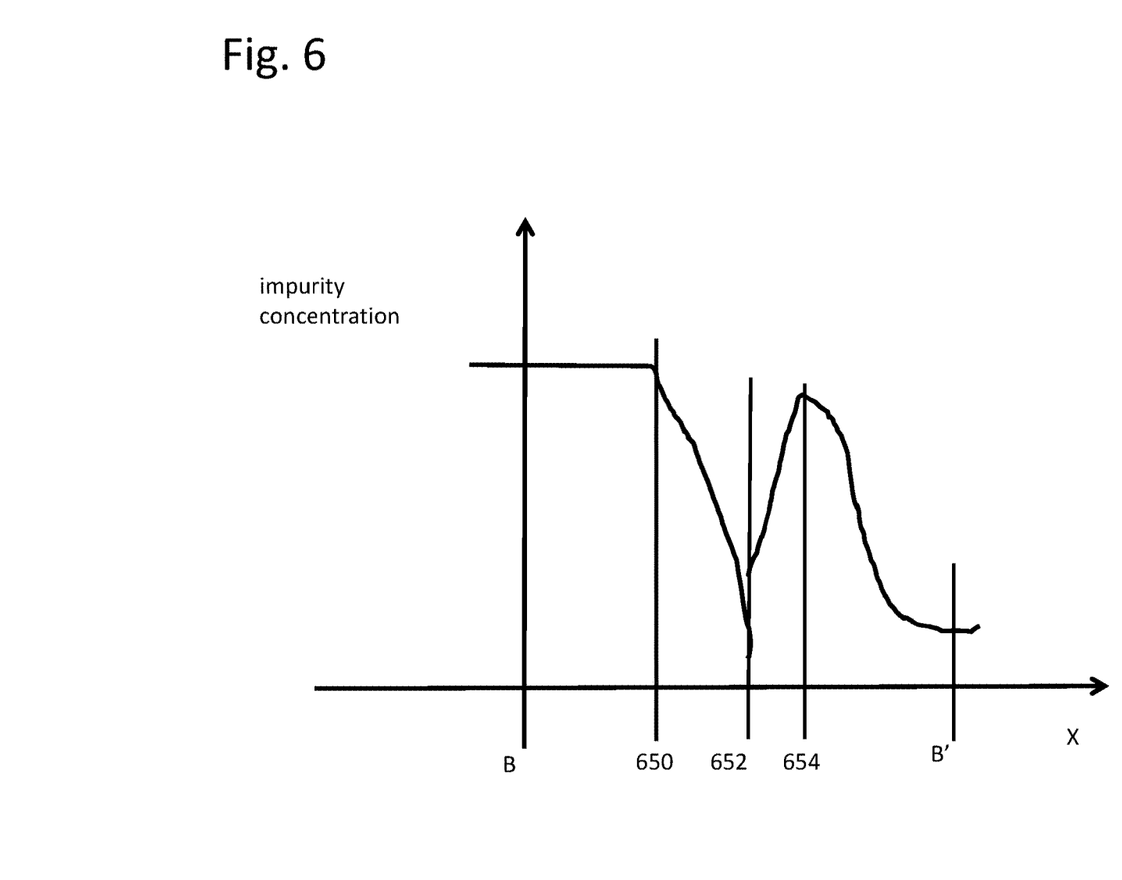
FIG. 6 is graph of an example doping concentration profile along section B-B' of FIG. 4.

FIG. 6 shows an example doping profile along section B-B' of FIG. 4. In the p-gate region between points B and 650 on the graph, corresponding to the portion of section line B-B' within region 202 of FIG. 4, the impurity concentration may be, for example, between 2e18 and 5 e18 cm-3. Entering the implanted channel region 205 of FIG. 4, corresponding to region between point 650 to 652 on FIG. 6, the concentration dips, and at point 654 changes over to n-type, then rises to a peak at point 654, before dipping again to the lower value found at the core of the mesa at point B', corresponding to the region 230 of FIG. 4. The peak n-type concentration in channel 205 at point 654 may be, for example 10 to 100 times greater than that at point B', thus ensuring that the doping of the implanted channel 205 dominates the threshold voltage determination for the vertical JFET 400. At the same time, the graded nature of the junction 652 made by this selection of implant depths and doses allows the gate-source breakdown to be high enough for proper off-state operation, while still allowing enough channel charge for the target Vth in the -4V to -10V range for normally-on JFETs with minimal variation.

For optimum performance, the n-region 230 may be kept shallower than the channel implant region 205. If the region 230 is defined by epi growth, while the depth of the channel implant 205 is determined by the implant conditions as well as trench depth, some process tolerance should be part of the design of the trench JFET. For example, the regions 230 may be between 0.1 to 1 um shallower than the bottom of the implanted region 205.

Figure 7:
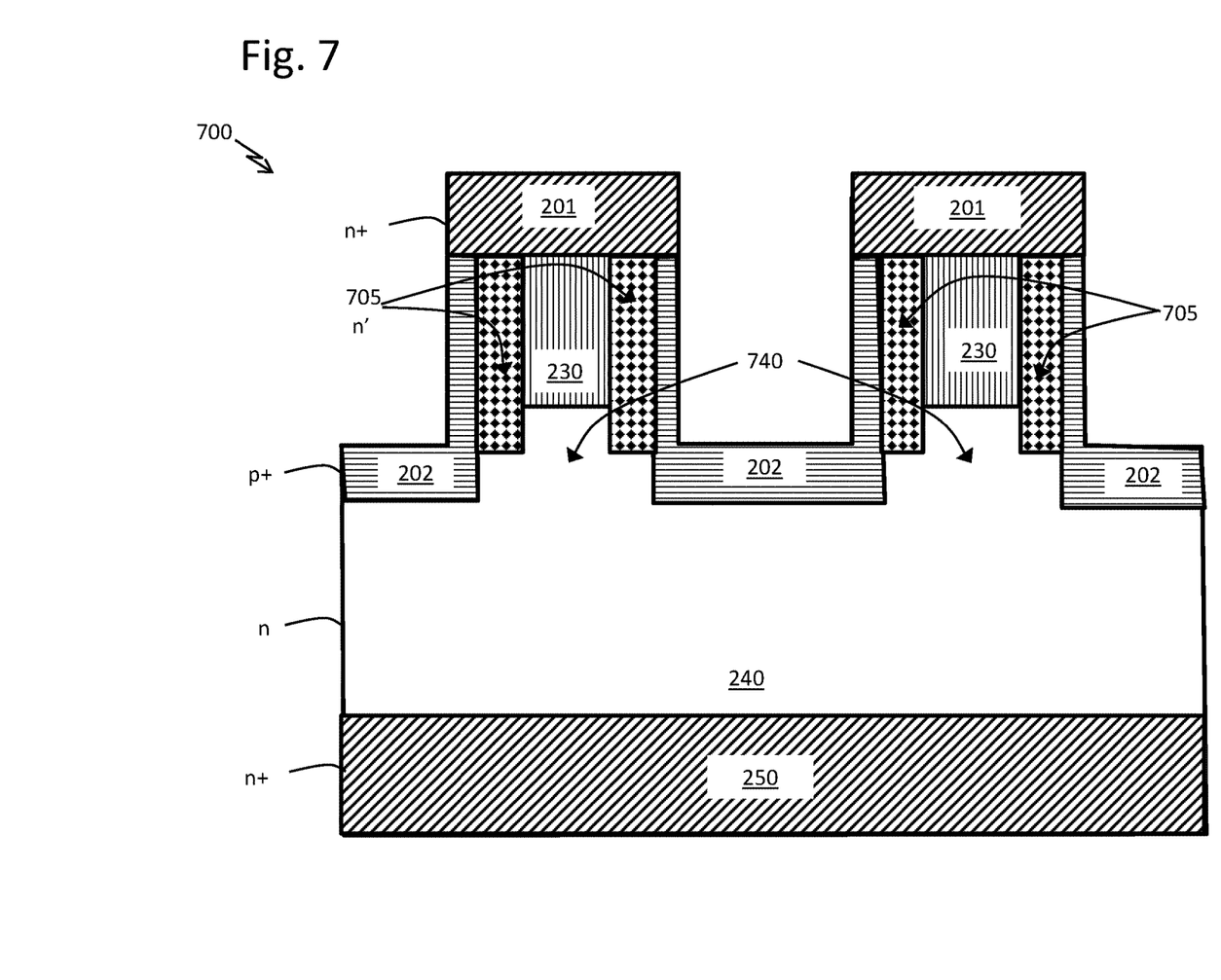
FIG. 7 is a vertical cross-sectional view of an alternative trench JFET with short vertical channel regions.

FIG. 7 illustrates a trench JFET where the implanted channel regions 705 do not extend far enough for optimal performance. As in FIG. 2, the trench JFET 700 of FIG. 7 has a substrate 250 and a drift region 240 of a first doping type. Atop the mesas are source regions 201 of the first doping type. On the sides of the mesas and bottoms of the trenches is a gate material 202 that is of a second doping type. Within the mesas adjacent to the gate material 202 are implanted channel regions 705 of the first doping type, and at the core of the mesas are lightly doped regions 230. In this example, there are regions 740 within the mesa beneath the implanted channel regions 705. This may leads to a second JFET region formed in regions 740 between the gate regions 202. In a normally-on JFET, since the region 740 shares the same doping as region 240 based, which may be selected for a target Vds breakdown voltage of >600 V, the JFET may pinch off at a much lower voltage than the target set by the channel implanted portion 705. For example, in a 1200 V normally-on JFET, if the epi doping is 8e15 cm-3 in regions 240 and 740, while the channel 205 peak doping is 1e18 cm-3 for a target Vth of −6 to −8V, the lower region 740 may have a Vth of −2 to −4V, which is far from the desired value. That may also lead to a much higher on-resistance and lower saturation current.

To address and prevent such problems, the channel implants 205 may be arranged, e.g., by using both angled and vertical implants of specific energies, to ensure that the n-implant wraps around the portions of p-gate region 202 at the bottoms of the mesas. This ensures that the Vth at the bottom of the channel is more negative than the upper part of the channel 205 in the vicinity of mesa core region 230, and does not control the device Vth. This minimizes variations in device Vth, on-resistance and saturation current.

Figure 8:
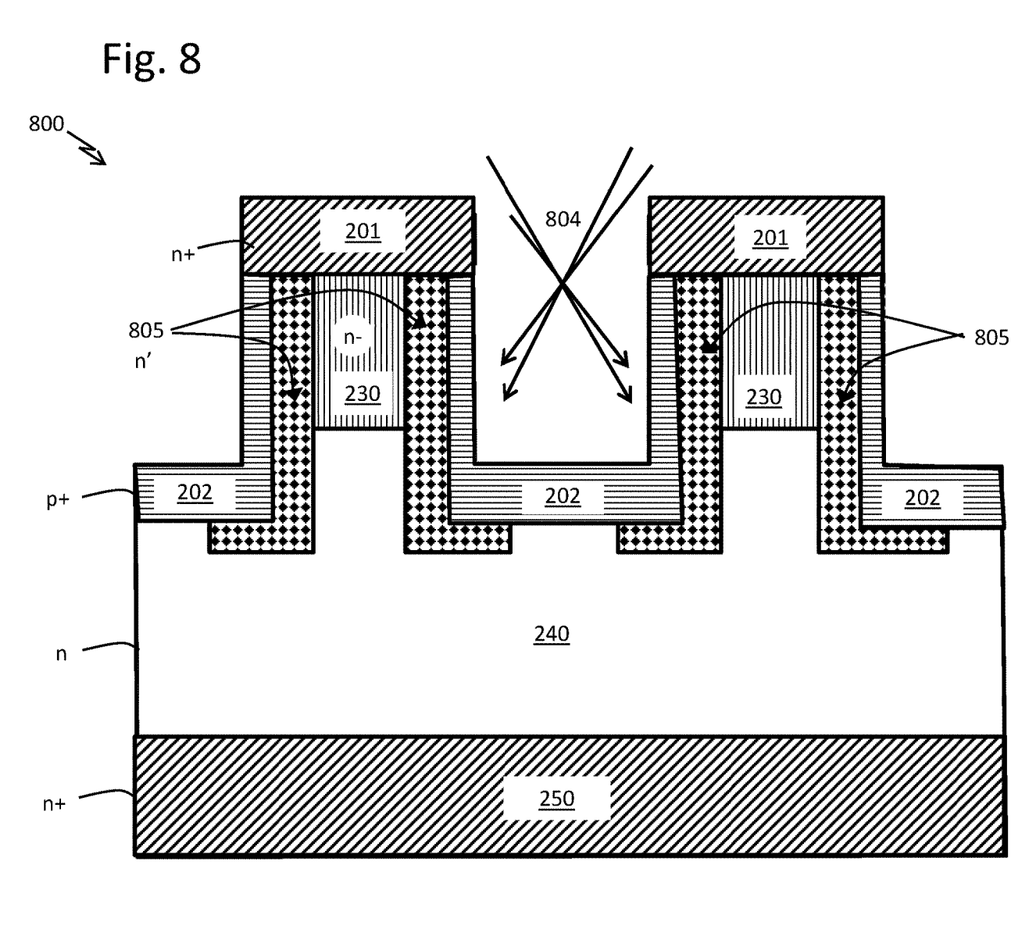
FIG. 8 is a vertical cross-sectional view of an alternative trench JFET with channel regions which wrap around the gate regions at the base of the mesa.

FIG. 8 is a vertical cross-sectional view of an alternative trench JFET 800 with an angle-implanted vertical channel region. The structure of JFET 800 is similar to that of JFET 200 of FIG. 2, with a substrate 250, a drift region 240, and source regions 201 that are doped with a doping of a first kind. The source regions 201 sit atop mesas which have a lightly doped core regions 230 and channel regions 805 which are also of the first doping type. The sides of the mesas and bottoms of trenches have gate regions 202 with a doping of a second kind. The channel regions 805, in contrast to the channel regions 205 of FIG. 2, for example, extend below the mesa and wrap under a portion of the gate 202 at the bottom of the trenches. This is achieved by adjusting the angle and energy of implants 804 that are used to form the channel regions 805. The use of wrap-around channel regions such as regions 805 has the effect of reducing the drain-to-source resistance when the JFET 800 is in conducting mode $R_{DS}$on.

Figure 9:
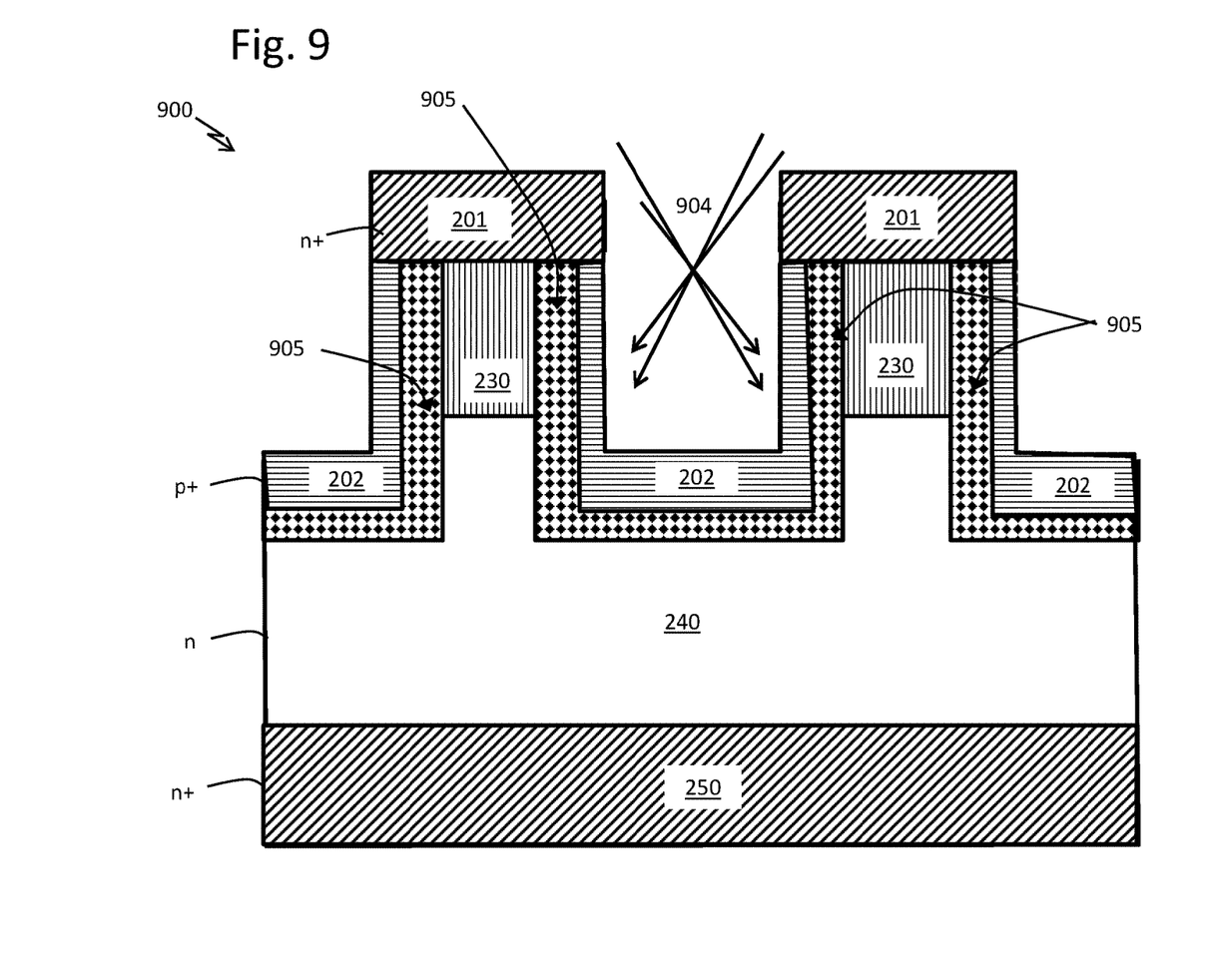
FIG. 9 is a vertical cross-sectional view of another alternative trench JFET with channel regions wrap around the gate regions at the base of the mesa and bottoms of the trenches.

FIG. 9 is a vertical cross-sectional view of another alternative trench JFET 900 with an angle-implanted vertical channel region. The structure of JFET 800 is similar to that of JFET 200 of FIG. 2 and JFET 800 of FIG. 6, with a substrate 250, a drift region 240, and source regions 201 that are doped with a doping of a first kind. The source regions 201 sit atop mesas which have a lightly doped core regions 230 and channel regions 905 which are also of the first doping type. The sides of the mesas and bottoms of trenches have gate regions 202 with a doping of a second kind. The channel regions 905, in contrast to the channel regions 805 of FIG. 6, for example, not only extend below the mesa, but also wrap under all of the gate regions 202 at the bottom of the trenches. This is achieved by adjusting the angle and energy of implants 904 that are used to form the regions 805. Again, the use of wrap-around channel regions such as regions 905 has the effect of reducing $R_{DS}$on.

EXAMPLES

The concepts herein may be embodied in trench JFET transistors comprising, for example: a substrate having a heavily doped backside drain region and a medium doped topside substrate drift region, the drain region and the drift region being of a first doping type; active cell mesas extending from the top of the drift region, the mesas being of substrate material and separated by trenches cut into the substrate material; heavily doped source regions at the tops of the mesas, the source regions being of the first doping type; medium doped mesa drift regions at the bottom center of the mesas, the mesa drift regions being of the first doping type; heavily doped gate regions on the surfaces of the trenches, the gate regions being of a second doping type, the second doping type being the opposite of the first doping type; and angle implant doped vertical channel regions between the portion of the gate regions on the vertical walls of the trenches and the centers of the mesas, the angle implant doped vertical channel regions extending substantially the height of the mesas, and being of the first doping type, and having a doping level higher than the drift region. Such trench JFET transistors may comprise silicon carbide, gallium nitride, and/or other semiconductor materials. These trench JFET transistors may further comprise lightly doped channel core regions at the middle of the mesas, the channel core regions being of the first doping type, the channel core regions extending horizontally between the angle implant higher doped channel regions and extending vertically a portion of the height of the mesa down from the source region. The doping level of the vertical angle implant doped channel regions may be several times higher, e.g., five or ten times higher, or more, than that of the drift region.

The precise doping levels can be adjusted in accordance with particular design goals such as, for example, standoff and/or threshold voltages. In general, the backside drain region is more heavily doped than the drift region. This is done to facilitate backside ohmic contact or ohmic region formation. Similarly the source regions are heavily doped, relative to the drift region, also for the purpose of creating contacts or contact regions. The gate regions are also heavily doped, but with a doping type opposite of that of the drain, drift and source regions. The optional lightly doped channel core regions at the middle of the mesas may be more lightly doped than the drift region.

The concepts herein may be embodied in methods of fabricating trench JFETs from a substrate of a first doping type, where, for example, the substrate comprises: a heavily doped backside drain region; a center medium doped drift region; and a topside heavily doped source region. The methods may include: etching trenches into the substrate from the topside to form mesas comprising drift region material and source region material; implanting dopant of a second doping type on the bottoms and sides of the trenches to form gate regions; implanting dopant of the first doping past the gate regions on the sides of the trenches and into the mesas. The substrate may comprise silicon carbide, gallium nitride, and/or other semiconductor materials. Methods may further include the use of a substrate that further comprises, between the drift region and the source region, a lightly doped channel region. In such case, the processes may further include, when etching trenches into the substrate from the topside, etching through both the source region and the channel region, such that the mesas further comprise a section of channel region material between drift region material and the source region material. The implanting of dopant of the first kind may be designed to create vertical angle implant doped channel regions that are doped several times higher, e.g., five or ten times higher, or more, than is the drift region.

In describing preferred embodiments of the subject matter of the present disclosure, as illustrated in the figures, specific terminology is employed for the sake of clarity. The claimed subject matter, however, is not intended to be limited to the specific terminology so selected, and it is to be understood that each specific element includes all technical equivalents that operate in a similar manner to accomplish a similar purpose. When ranges are used herein for physical properties, such as chemical properties in chemical formulae, all combinations, and subcombinations of ranges for specific embodiments therein are intended to be included.

Those skilled in the art will appreciate that numerous changes and modifications can be made to the preferred embodiments of the invention and that such changes and modifications can be made without departing from the spirit of the invention. It is, therefore, intended that the appended claims cover all such equivalent variations as fall within the true spirit and scope of the invention.

What is claimed:

1. A trench JFET, comprising:
   a) a substrate comprising a backside drain region and a topside drift region, the backside drain region and the topside drift region being of a first doping type, wherein the first doping type is n-type;
   b) mesas, the mesas extending from the topside drift region, wherein the mesas are separated by trenches cut into the topside drift region; and
   c) in each mesa, a source region, a gate region, a vertical channel region, and a first mesa core region and a second mesa core region;
   d) wherein the source region is of the first doping type and is located at the tops of the mesa;
   e) wherein the gate region is of a second doping type and is located on the surfaces of the trenches, wherein the second doping type is p-type, and wherein the gate region abuts the source region;
   f) wherein the first and second mesa core regions are of the first doping type, wherein the first mesa core region is located beneath source region and above the second mesa core, with the first mesa core region abutting the source region and the second mesa core region, and wherein the doping concentration at the center of the first mesa core region is at least ten times lower than that of the topside drift region;
   g) wherein the vertical channel region is of the first doping type, where in the vertical channel region extends vertically substantially the height of the mesas and abuts the source region, and wherein the vertical channel region extends laterally to abut a portion of the gate region on the vertical wall of the trench and to abut a portion of the first mesa core region and a portion of the second mesa core region; and
   h) wherein the peak doping concentration of the vertical channel region is at least ten times higher than the doping level of the center of the first mesa core region.

2. The trench JFET of claim 1, wherein the substrate further comprises silicon carbide.

3. The trench JFET of claim 1, wherein the substrate further comprises gallium nitride.

4. The trench JFET of claim 1, wherein the peak doping concentration of the vertical channel region is at least twenty times higher than the doping level of the center of the first mesa core region.

5. JFET of claim 1, wherein the peak doping concentration of the vertical channel region is at least fifty times higher than the doping level of the center of the first mesa core region.

6. The trench JFET of claim 1, further comprising an extension of the vertical channel region, wherein the extension of the vertical channel region extends past the bottom of the mesa and laterally beneath a portion of the gate region along the bottom of the trench, but does not extend fully across the bottom of the trench.

7. The trench JFET of claim 6, wherein the substrate further comprises silicon carbide.

8. The trench JFET of claim 6, wherein the substrate further comprises gallium nitride.

9. The trench JFET of claim 6, wherein a portion of the gate region on the bottom of the trench is doped more heavily than the portion of the gate region on the vertical wall of the trench.

10. The trench JFET of claim 1, wherein the source region extends the full width of the mesa.

11. The trench JFET of claim 1, wherein a gate-source junction extends to the sidewall of the mesa.

12. The trench JFET of claim 1, wherein a portion of the gate region on the bottom of the trench is doped more heavily than the portion of the gate region on the vertical wall of the trench.

* * * * *